(12) United States Patent
Maruyama et al.

(10) Patent No.: US 6,410,354 B1
(45) Date of Patent: Jun. 25, 2002

(54) SEMICONDUCTOR SUBSTRATE TEST DEVICE AND METHOD

(75) Inventors: Shigeyuki Maruyama; Naoyuki Watanabe; Daisuke Koizumi, all of Kawasaki; Akira Sawamori, Kasugai, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/906,675

(22) Filed: Jul. 18, 2001

(30) Foreign Application Priority Data

Jul. 31, 2000 (JP) .......................... 2000-232304

(51) Int. Cl.⁷ .............................................. H01L 21/00
(52) U.S. Cl. ................. 438/14; 438/7; 257/48
(58) Field of Search ................ 438/14–18, 5–13, 438/800; 257/48, 798

(56) References Cited

PUBLICATIONS

Derwent Abstract Publication No. RD 422088A, "Wafer Contact Method for Membrane Probe—. . ." IMC Jun. 10, 1999. (Abstract Only).*

* cited by examiner

*Primary Examiner*—Craig Thompson
(74) *Attorney, Agent, or Firm*—Armstrong, Westerman & Hattori, LLP (57) ABSTRACT

A semiconductor substrate test device includes a contactor having contact electrodes to be connected with terminals formed on a semiconductor substrate, and a drag supply part supplying a drag to prevent a deformation of the contactor caused by a contact force resulting from contacts of the contact electrodes with the terminals.

24 Claims, 10 Drawing Sheets

SEMICONDUCTOR SUBSTRATE TEST DEVICE AND METHOD

BACKGROUND OF THE INVENTION

1. Field of the Invention

The present invention generally relates to semiconductor substrate test devices and methods, and more particularly to a semiconductor substrate test device and method for testing a semiconductor substrate by placing a plurality of terminals formed on the semiconductor substrate in contact with contact electrodes formed on a contactor.

In recent years, finer pitches in semiconductor devices represented by large-scale ICs have caused circuits to have higher density and terminals to be increased in number and smaller in size.

Such higher density of semiconductor devices is essential in electronic devices employing the semiconductor devices, for instance, small portable devices such as a telephone, a mobile personal computer, and a video-integrated camera, and high-performance computers required to have high-speed operation reliability.

Therefore, a demand has been rapidly increased for shipping the semiconductor devices in the form of a KGD (Known Good Die), that is, in an unpackaged chip state with guarantees on their functions, or in the form of a CSP (Chip size package) that is a small-size package having the same outer dimensions as those of an LSI chip.

Further, in the light of increasing the efficiency of the tests of the semiconductor devices, there has been growing necessity for conducting all reliability tests on semiconductor chips in a wafer state before the wafer is cut into the individual semiconductor chips instead of testing each individual semiconductor chip separated from the wafer. Hereinafter, a test conducted on semiconductor chips in a wafer state is referred to as a wafer-level test.

2. Description of the Related Art

A conventional wafer-level test is conducted by electrically connecting a plurality of semiconductor chips formed on a wafer with a contactor by placing a plurality of terminals formed on the semiconductor chips in contact with contact electrodes formed on the contactor.

This wafer-level test allows a reliability test to be conducted without cutting the wafer into individual semiconductor chips, thus increasing the handling efficiency of the test. That is, the individual semiconductor chips obtained by dicing vary in size so as to be prevented from being handled by the same handler, while the wafer is handled easily in the wafer-level test since the wafer is standardized in size and tested directly by the wafer-level test.

Further, the wafer-level test provides information on the acceptability of the semiconductor chips, which information can be managed as a wafer map. Therefore, the wafer-level test allows analysis of which semiconductor chip on the wafer has what type of deficiency, and can be easily compared with a preliminary test (PT), thus increasing the reliability of a test process.

Moreover, in the case of a recently developed wafer-level CSP, semiconductor chips are processed in a wafer state all through to the end of a CSP packaging process in a production process. If a test on the semiconductor chips in the wafer state is realized and added to this, the semiconductor chips can be handled in the form of a wafer all through the processes of a wafer process, packaging, and test, thus making the production process more efficient.

However, the above-described wafer-level test includes the following disadvantage due to the above-described increase in the number of terminals and decrease in the size of a terminal shape.

That is, the number of terminals formed on a wafer sums up to a very large number, that is, 20,000 to 100,000, in the case of an eight-inch wafer, for instance. In order to place these numerous terminals in secure contact with the contact electrodes of the contactor of a test device, supposing that a contact force of approximately 98 mN per terminal is required, a contact force of approximately 2,000 to 10,000 N is required for the entire wafer.

If the wafer is to be placed in contact with the contactor of the test device by such a large contact force, the contactor may give way to the load to be distorted and deformed to such an extent that the contactor may finally be broken. Further, the wafer as well as the contactor may be damaged.

In this case, the contactor may be reinforced by a plate. However, this method cannot altogether prevent the deformation of the contactor although effective in reducing the deformation to some extent, and this residual deformation of the contactor causes poor connections between the contactor and the terminals of semiconductor devices formed minutely with high density. Further, the reinforcement of the contactor by the plate adds to the weight of the contactor, thus making it difficult to handle the contactor, for instance, in carrying it.

SUMMARY OF THE INVENTION

It is a general object of the present invention to provide a semiconductor substrate test device and method in which the above-described disadvantage is eliminated.

A more specific object of the present invention is to provide a semiconductor substrate test device and method for conducting a test on each of semiconductor devices formed on a semiconductor substrate, without distorting, deforming, and breaking a contactor, by placing terminals formed on the semiconductor devices in contact with terminals formed on the contactor.

The above objects of the present invention are achieved by a semiconductor substrate test device including a contactor having contact electrodes formed on a first face thereof, the contact electrodes being connected with terminals formed on a first face of a semiconductor substrate, and a drag supply part supplying a drag to prevent a deformation of the contactor, the deformation being caused by a contact force generated when the contact electrodes are placed in contact with the terminals.

According to the above-described semiconductor substrate test device, the contact force and the drag applied to the sides of the contactor are balanced with each other, thus preventing the distortion, deformation, and breakage of the contactor.

The above objects of the present invention are also achieved by a semiconductor substrate test device including a contactor having contact electrodes formed thereon, the contact electrodes being connected with terminals formed on a semiconductor substrate, a sensor detecting a deformation of said contactor, the deformation being caused by a contact force generated when the contact electrodes are placed in contact with the terminals, and a deformation control part generating a drag to eliminate the deformation.

According to the above-described semiconductor substrate test device, an appropriate drag for eliminating the deformation of the contactor can be supplied with accuracy.

The above objects of the present invention are also achieved by a method of testing a semiconductor substrate including the steps of (a) placing contact electrodes formed on a contactor in contact with terminals formed on the semiconductor substrate, and (b) providing a contact force to place the contact electrodes in contact with the terminals and a drag to prevent a deformation of the contactor caused by the contact force.

According to the above-described method, the contact force and the drag applied to the sides of the contactor are balanced with each other, thus preventing the distortion, deformation, and breakage of the contactor.

The above objects of the present invention are further achieved by a method of testing a semiconductor substrate by placing contact electrodes formed on a contactor in contact with terminals formed on the semiconductor substrate, which method includes the steps of (a) detecting a deformation of the contactor, and (b) providing a drag to eliminate the deformation.

According to the above-described method, an appropriate drag for eliminating the deformation of the contactor can be supplied with accuracy.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

In the present invention, a semiconductor substrate refers to a substrate on which a plurality of semiconductor chips are formed, such as an LSI wafer on which a plurality of semiconductor chips are formed, a general wafer-level CSP having external output terminals formed of, for instance, copper (Cu) connected with the electrodes of semiconductor chips formed on a wafer and provided in different positions from those of the electrodes on the wafer, or a multiple CSP that is collectively resin-sealed CSPs formed on a substrate.

Prior to the description of the embodiments of the present invention, a description will first be given of the technical premise of the present invention.

Semiconductor substrate test devices include those having numerous protruding contact electrodes formed on a membranous wiring substrate (hereinafter those are referred to as membrane-type semiconductor substrate test devices) and those having numerous pin probe-like contact electrodes hanging down from the periphery of a circular opening formed in the center of a wiring substrate into the opening (hereinafter those are referred to as pin probe-type semiconductor substrate test devices).

Figures 1A, 1B:
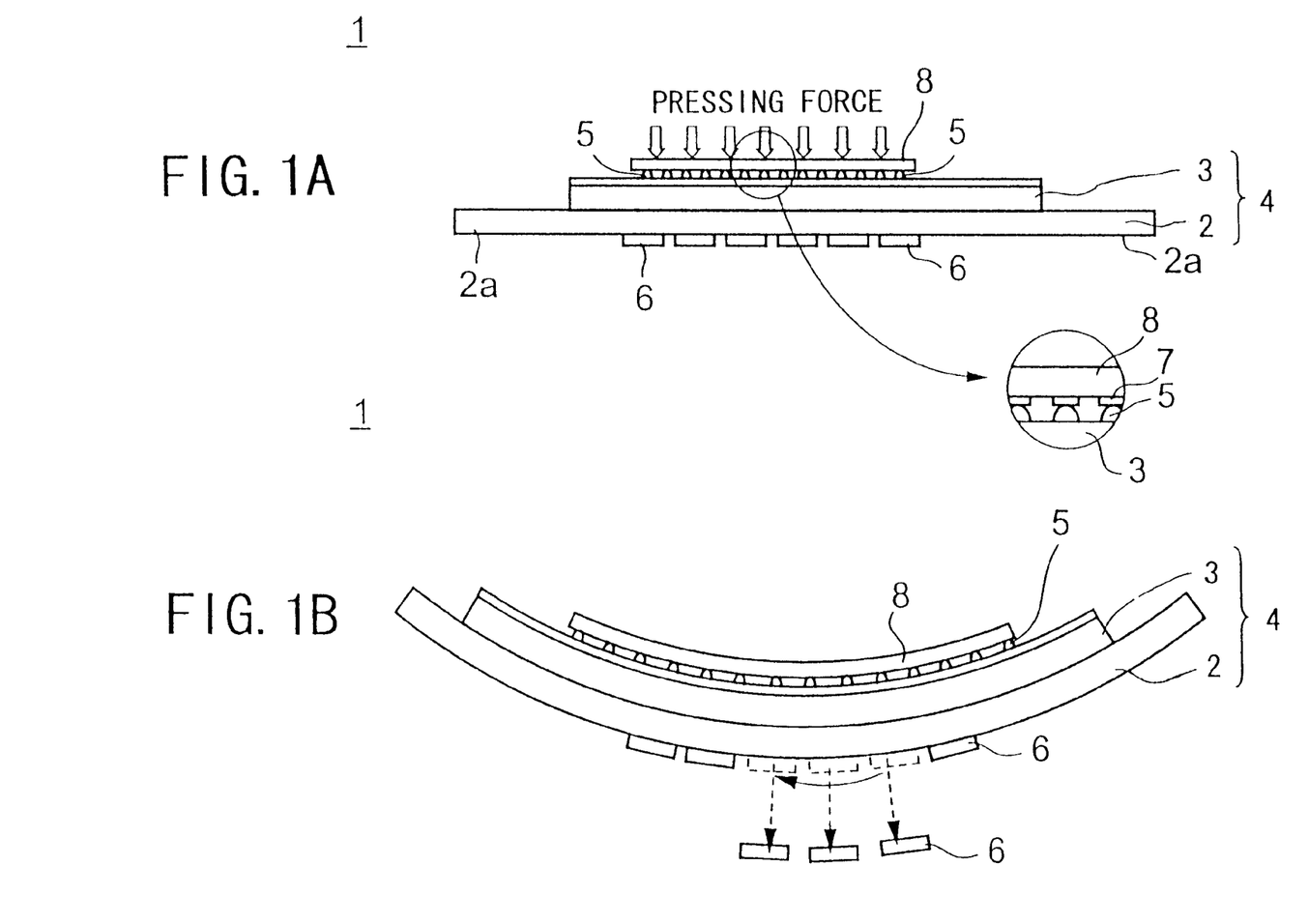
FIG. 1A is a side view of a membrane-type semiconductor substrate test device before a contact force is applied thereto.
FIG. 1B is a side view of the semiconductor substrate test device of FIG. 1A with the contact force being applied thereto.

FIGS. 1A and 1B are diagrams for illustrating a state of deformation of a contactor 4 of a membrane-type semiconductor test device 1.

As shown in FIGS. 1A and 1B, the membrane-type semiconductor test device 1 includes the contactor 4 connected electrically with a wafer 8 having numerous terminals 7 formed thereon. This contactor is defined by a multilayer substrate 2 and a wiring substrate 3. The multilayer substrate 2 is defined by, for instance, a multilayer printed wiring substrate. The wiring substrate 3 includes a resin base film on which a wiring pattern is formed. The wiring substrate 3 is provided on (bonded to) the multilayer substrate 2.

A plurality of contact electrodes 5 are formed on a part of the wiring pattern formed on the wiring substrate 3. Further, the multilayer substrate 2 has its peripheral part 2a supported by a support member (not shown).

In recent years, a plurality of electronic circuit components (electronic components) 6 for a test, such as an electronic circuit for assisting the operations of semiconductor chips formed on the wafer 8 at a time of conducting the test and an electronic circuit for assisting a testing operation, have been provided on the bottom face of the multilayer substrate 2. This configuration allows shorter lengths of interconnection lines between the semiconductor chips and the electronic circuit components 6, which is suitable for the test of semiconductor chips operating at a high speed.

In conducting a semiconductor substrate test by using the semiconductor substrate test device 1 having the above-described structure, the contactor 4 is placed to have the contact electrodes 5 facing upward and the wafer 8 is placed to have the terminals 7 opposing the contact electrodes 5. At this point, the wafer 8 is placed on the contactor 4 so that the terminals 7 of the wafer 8 are positioned on the corresponding contact electrodes 5 of the contactor 4. Further, as shown in FIG. 1A, a pressing force is applied from above the wafer 8 evenly to the entire face of the wafer 8 by proper pressing means in order to secure electrical connections between the contact electrodes 5 and the terminals 7. This pressing force serves as a force to place the terminals 7 in contact with the contact electrodes 5 (hereinafter, this force is referred to as a contact force).

In this case, if a pressing force stronger than the stiffness of each of the wafer 8 and the multilayer substrate 2 is applied in order to obtain a sufficient contact force, each of the substrate 2 having its peripheral part 2a supported by the support member, the wiring substrate fixed on the multilayer substrate 2, and the wafer 8 contacting the wiring substrate 3 has its center part, which receives the pressing force, deformed into a downward convex shape. Further, if the pressing force is stronger than the strength of the multilayer substrate 2 or the wafer 8, the multilayer substrate 2 or the wafer 8 may be damaged.

As previously described, the electronic circuit components 6 are provided on the bottom face of the multilayer substrate 2, for instance, by soldering. Therefore, if the multilayer substrate 2 is deformed, an excessive stress is generated in solder joints so that solder removal may be caused in the worst case as shown in FIG. 1B.

Figure 2A:
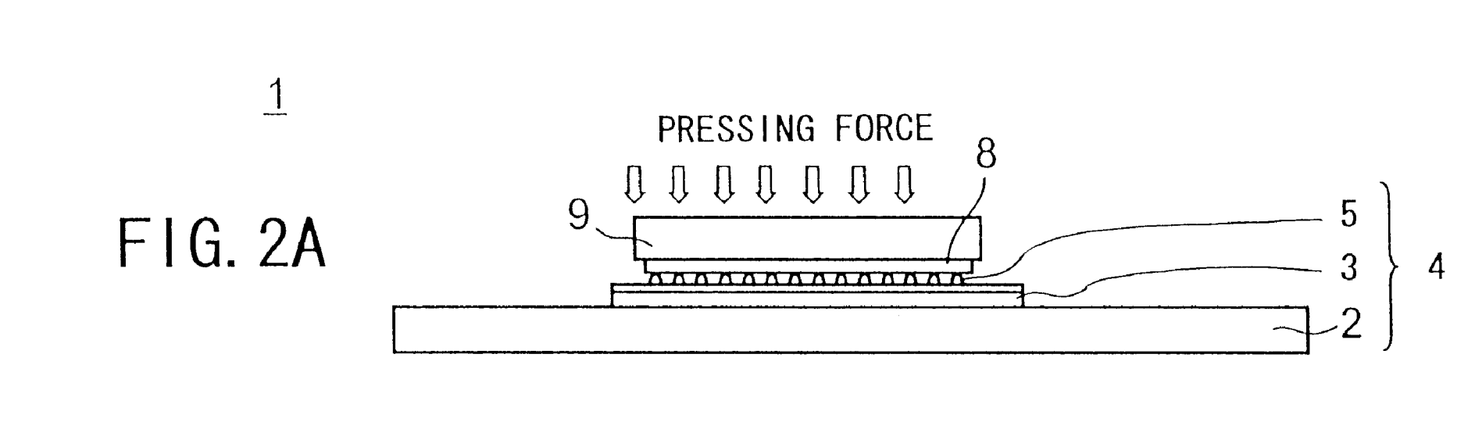
FIG. 2A is a side view of the semiconductor substrate test device of FIG. 1A having a reinforcement stage attached to a wafer before the contact force is applied thereto.
Figure 2B:
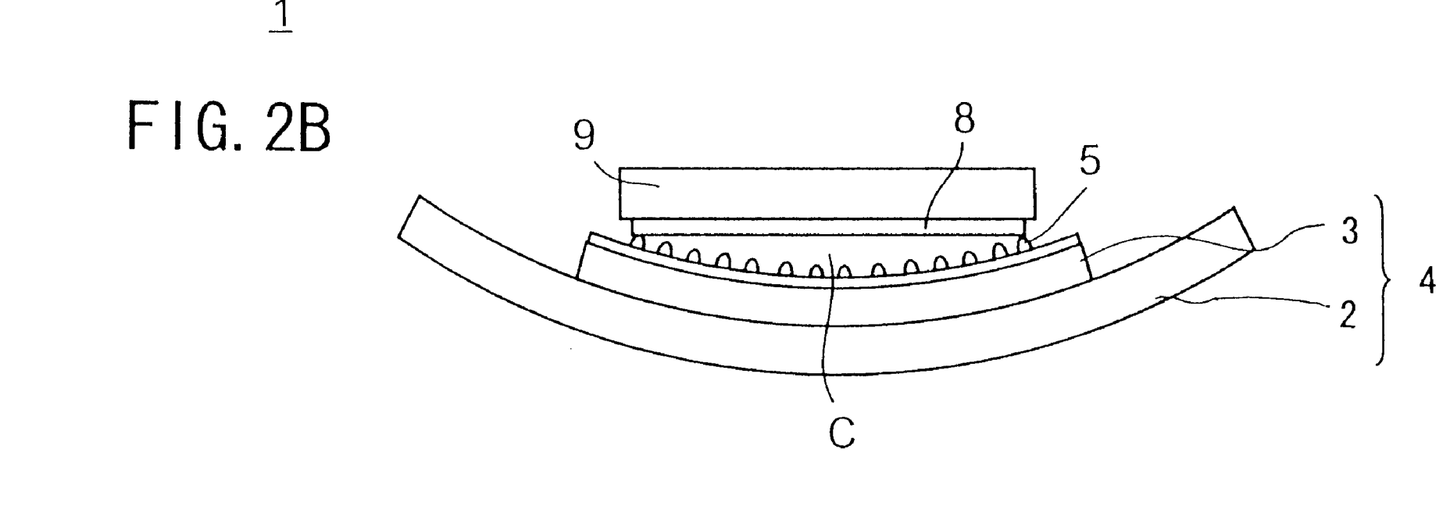
FIG. 2B is a side view of the semiconductor substrate test device of FIG. 2A with the contact force being applied thereto.

FIGS. 2A and 2B are diagrams for illustrating a state of deformation of the semiconductor substrate test device 1 having a reinforcement stage 9 attached to the wafer 8.

In order to prevent the deformation of the contactor 4 and avoid the above-described disadvantage, as shown in FIG. 2A, the reinforcement stage 9 is provided on the bottom face of the wafer 8, which face is shown as the top face thereof in FIG. 2A, so that the pressing force may be applied via the reinforcement stage 9 to the wafer 8.

However, this configuration also failed to prevent the deformation of the multilayer substrate 2 and the wiring substrate 3 as shown in FIG. 2B.

Indeed, the wafer 8 is reinforced by the reinforcement stage 9 and is prevented, though not completely, from being deformed so as to be maintained substantially in a flat state. However, the contactor 4, which is not reinforced, remains vulnerable to deformation. Further, generally, the contactor 4 is provided to have an area larger than that of the wafer 8. Therefore, if the pressing force is applied to a part of the contactor 4 which part opposes the wafer 8, this part is pressed down compared with the other part, so that the contactor is deformed into a downward convex shape. This deformation of the contactor 4 generates a cavity C between the wafer 8 and the wiring substrate 3. A distance therebetween is maximized at the center part of the cavity C. In the cavity C, the terminals 7 and the contact electrodes 5 are not in contact so as to be electrically disconnected.

On the other hand, a contactor reinforced by a plate not only has the above-described disadvantages, but also is prevented from including resistors, capacitors, and fuses that form the above-described electronic circuits, which may decrease accuracy in testing semiconductor chips operating at a high speed.

Figure 3A:
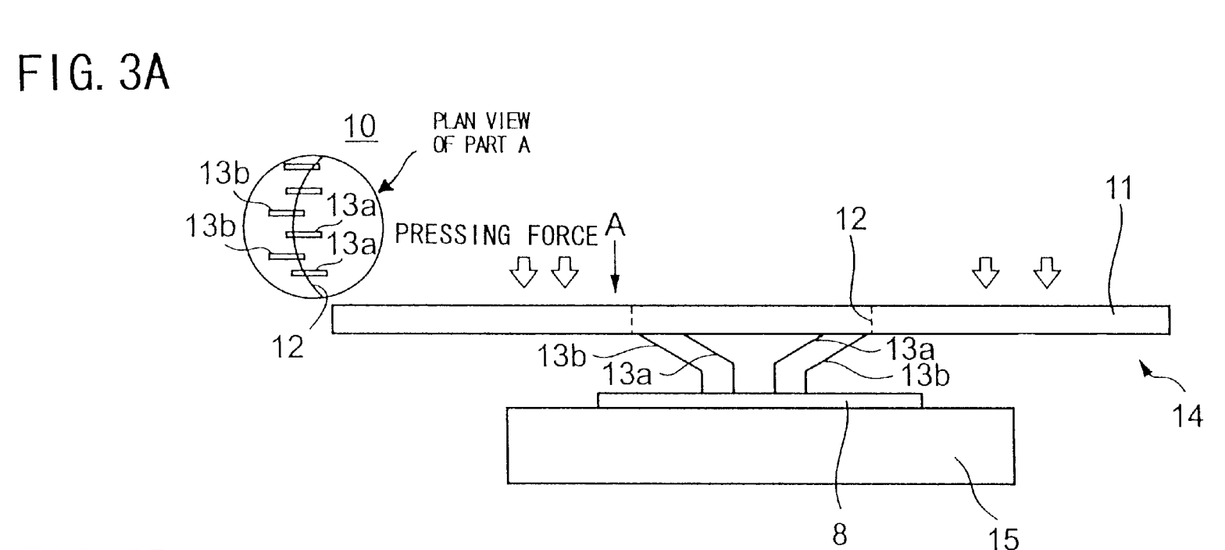
FIG. 3A is a side view of a pin probe-type semiconductor substrate test device before a contact force is applied thereto.
Figure 3B:
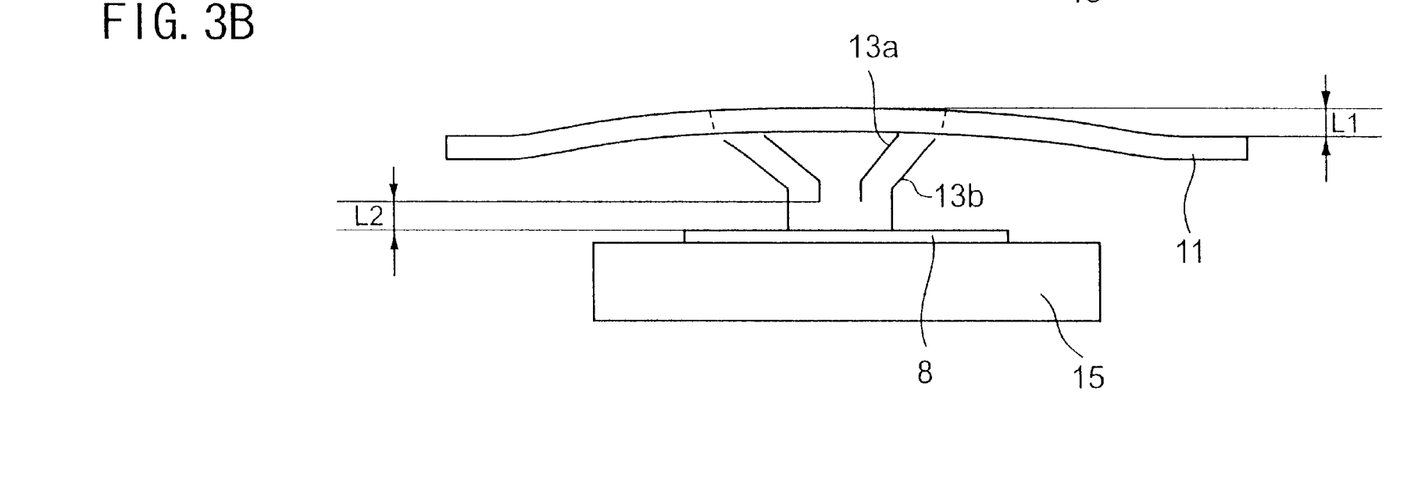
FIG. 3B is a side view of the semiconductor substrate test device of FIG. 3A with the contact force being applied thereto.

Next, a description will be given, with reference to FIGS. 3A and 3B, of a pin probe-type semiconductor substrate test device 10. FIGS. 3A and 3B are diagrams for illustrating a state of deformation of a contactor 14 of the semiconductor substrate test device 10. The semiconductor substrate test device 10 is defined by the contactor 14 and a stage 15. The contactor 14 includes a laminated substrate 11 (for instance, a glass epoxy resin board) and a plurality of pin probes (contact electrodes) 13a through 13n. The laminated substrate 11 has an opening 12 formed in its center part, and the pin probes 13a through 13n extend downward, or toward the wafer 8, from the opening 12.

In conducting a semiconductor substrate test by using the pin probe-type semiconductor substrate test device 10, the wafer 8 is placed on the stage 15 of the semiconductor substrate test device 10, and the contactor 14 is placed on the wafer 8 so that the pin probes 13a through 13n of the contactor 14 are positioned on the terminals 7 of the wafer 8.

Then, as shown in FIG. 3A, a pressing force is applied from above evenly to the entire face of the contactor 14 by proper pressing means so as to secure electrical connections between the pin probes 13a through 13n and the terminals 7.

At this point, as previously described, the pressing force must have a very large value (approximately, 2,000 to 10,000 N) to secure a sufficient contact force between all the pin probes 13a through 13n and the terminals 7. Therefore, the pressing force exceeds the stiffness of each of the wafer 8 and the contactor 14. Thus, only the peripheral part of the contactor 14, to which part the pressing force is applied, is deformed, and the entire contactor 14 is deformed into a downward concave shape.

At this point, the pin probes 13b, which are arranged outside in a radial direction of the downward concave contactor 14, contact corresponding ones of the terminals 7, but the pin probes 13a, which are arranged inside in the radial direction of the contactor 14, float above corresponding ones of the terminals 7 with a distance L2 therebetween. The distance L2 is substantially equal to the amount of deformation L1 measured between the pin probes 13a and 13b of the contactor 14. Therefore, as shown in FIG. 3B, the pin probe 13b is prevented from contacting the corresponding one of the terminals 7, thus causing an electrical disconnection therebetween.

As described above, it has been found that, in the membrane-type and pin probe-type semiconductor substrate test devices 1 and 10, irrespective of their types, the contactors 4 and 14 are deformed by the pressing force (contact force) so that some of the contact electrodes 5 and pin probes 13a through 13n are out of contact with the terminals 7, thus causing electrical disconnections therebetween. Further, it has been found that the electronic circuit components 6 mounted on the contactors 4 and 14 are removed from the contactors 4 and 14 due to the above-described deformation. Moreover, it has been found that the contactor 4 cannot escape from deformation even with the reinforcement stage 9.

The inventors of the present invention, based on these findings, have devised a semiconductor substrate test device and method for reliably preventing contactor deformation. A description will now be given of the semiconductor substrate test device and method. In the following drawings, the same elements as those of FIGS. 1 through 3 are referred to by the same numerals. The terminals 7 formed on the wafer 8 are not shown in the following drawings of each embodiment.

First, a description will be given, with reference to FIG. 4, of a semiconductor substrate test device 100 and a semiconductor substrate test method according to a first embodiment of the present invention.

The semiconductor substrate test device 100 includes the contactor 4, an airtightness part 102, and a pressure fluid source 104. The contactor 4 includes the multilayer substrate 2 of a membrane type, and the wiring substrate 3 on which the numerous contact electrodes 5 are formed.

The airtightness part 102 is separated into an upper room 102b and a lower room 102c formed by a sidewall 102c with the sidewall 102c being in airtight contact with the peripheral part of the multilayer substrate 2. Compressed air is introduced from the pressure fluid source 104 into the upper and lower rooms 102b and 102c via introduction parts 106a and 106b, respectively. In this embodiment, the compressed air is employed as pressure fluid, but the pressure fluid is not limited to the compressed air. Any pressure fluid which may be other gas or liquid that can generate a later-described contact force and drag may be employed.

In this embodiment, the upper room 102b formed over the multilayer substrate 2 and the pressure fluid source 104 form a contact force supply device (part), and the lower room 102c formed under the multilayer substrate 2 and the pressure fluid source 104 form a drag supply device (part) of the semiconductor substrate test device 100.

In conducting a test on the wafer 8 that is a semiconductor substrate by using the semiconductor substrate test device 100 having the above-described structure, first, the wafer 8 is attached on the wiring substrate 3 of the contactor 4. At this point, the wafer 8 is attached with its face containing the terminals 7 (a terminal-containing face) facing downward so that the terminals 7 are positioned on the contact electrodes 5. Next, the upper and lower rooms 102b and 102c of the airtightness part 102 are attached to the multilayer substrate 2 so as to be in airtight contact therewith. Then, the pressure fluid source 104 is driven to introduce compressed air of, for instance, approximately $2 \times 10^5$ Pa into each of the upper and lower rooms 102b and 102c.

At this point, the pressure of the compressed air applied to the upper room 102b is exerted on the wafer 8 and the contactor 4 as a pressing force so that a contact force resulting from the pressing force is generated between the terminals 7 and the contact electrodes 5. On the other hand, the pressure of the compressed air of the same magnitude as that of the pressure applied to the upper room 102b is exerted as a drag on the bottom face of the multilayer substrate 2 of the contactor 4.

Thereby, the pressure of the compressed air is exerted evenly on each entire face of the multilayer substrate 2, thus preventing the deformation of the multilayer substrate 2 as well as the wiring substrate 3 provided thereon and the wafer 8. Therefore, the contact electrodes 5 and the terminals 7 are in secure contact over the entire contact part of the contactor 4 and the wafer 8, thus securing an electrical connection therebetween. A semiconductor substrate test, for instance, a reliability test such as a burn-in test, is conducted on the wafer 8 with the contactor 4 and the wafer 8 being securely connected.

As is not shown in the drawings, in the case of mounting the above-described electronic circuit components 6 on the bottom face of the multilayer substrate 2, the electronic circuit components 6 are prevented from being removed from the multilayer substrate 2 since the multilayer substrate 2 is free of deformation.

Further, even if there is a change in the supply pressure of the compressed air generated by the pressure fluid source 104, the multilayer substrate 2 is free of deformation since the same pressure in a changed state is applied to each of the top and bottom faces of the multilayer substrate 2.

In this embodiment, the single pressure fluid source 104 supplies the compressed air to the upper and lower rooms 102b and 102c. On the other hand, a pressure fluid source can be provided independently in each of the upper and lower rooms 102b and 102c.

According to this structure, however, a fluid pressure generated in each pressure fluid source may be slightly changed by ambient temperature since each pressure fluid source is independent. In such a case, as is different from this embodiment, there may be a difference in the applied pressure of the compressed air between the upper and lower rooms 102b and 102c of the airtightness part 102. This difference results in a slight deformation of the multilayer substrate 2, thus causing a poor connection. On the other hand, in this embodiment, the single pressure fluid source 104 supplies the compressed air to each of the upper and lower rooms 102b and 102c, thereby eliminating such a disadvantage. Further, the single pressure fluid source 104 is sufficient for the semiconductor substrate test device 100, thereby achieving the simplification of the structure and the cost reduction of the semiconductor substrate test device 100.

Figure 5A:
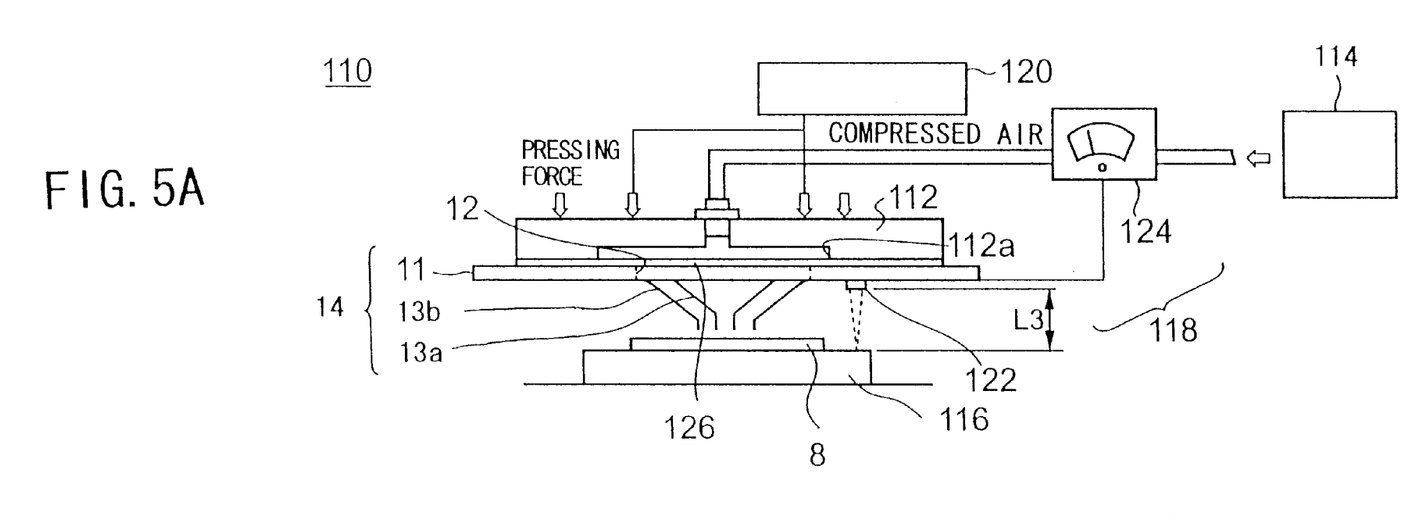
FIG. 5A is a side view of a semiconductor substrate test device before a contact force is applied thereto according to a second embodiment of the present invention.
Figure 5B:
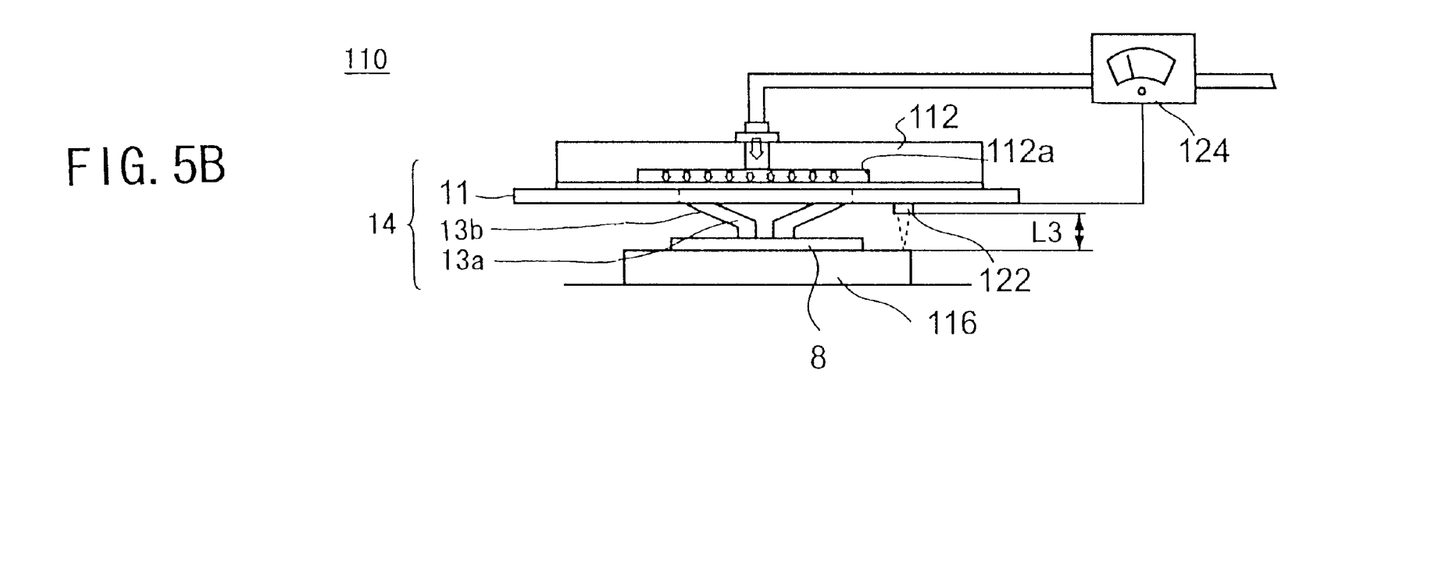
FIG. 5B is a side view of the semiconductor substrate test device of FIG. 5A with the contact force being applied thereto.

Next, a description will be given, with reference to FIGS. 5A and 5B, of a semiconductor substrate test device 110 and a semiconductor substrate test method according to a second embodiment of the present invention. FIGS. 5A and 5B are diagrams for illustrating a state of deformation of the semiconductor substrate test device 110.

The semiconductor substrate test device 110 includes the contactor 14, a pressure fluid source 114, a stand 116, a deformation control device (deformation control part) 118, a distance sensor (sensor) 122, and a contact force supply device 120.

The contactor 14 includes the above-described laminated substrate of a pin probe type and the pin probes (contact electrodes) 13a through 13n. The laminated substrate 11 has the opening 12 formed in its center part for extending the pin probes 13a through 13n toward the wafer 8.

The deformation control device 118 includes an airtightness formation part 112, a control part 124 controlling the pressure of compressed air generated by the pressure fluid source 114.

The airtightness formation part 112 generates a drag to the contactor 14.

The airtightness formation part 112 has a concave part 112a formed in the center part of its bottom face. The concave part 112a is smaller than the outer form of the laminated substrate 11 and larger than the opening 12 in size. As will be described later, a pressure fluid is supplied from the pressure fluid source 114 to the concave part 112a. A partition wall 126 for closing the opening 12 formed in the laminated substrate 11 is interposed between the airtightness formation part 112 and the laminated substrate 11 so that the pressure fluid may not flow out from the opening 12. Thereby, the concave part 112a and the partition wall 126 cooperate to form an airtight room, which is hereinafter referred to as an airtightness room 112a.

The stand 116 has the wafer 8 placed thereon. The contact force supply device 120, apart from the pressure fluid source 114, presses the contactor 14 down to the wafer 8 from above the airtightness formation part 112.

The distance sensor 122 is an optical distance-measuring sensor of a non-contact type, and is attached to the side of the contactor 14 from which side the pin probes 13a through 13n hang down.

The distance sensor 122 measures a distance L3 between the contactor 14 and the stand 116. Data on the distance L3 measured by the distance sensor 122 is transmitted to the control part 124.

The control part 124 controls the pressure of the compressed air supplied to the airtightness formation part 112 based on the data on the distance L3 measured by the distance sensor 122. Specifically, the control part 124 controls the pressure of the compressed air supplied to the airtightness formation part 112 by controlling the opening of a pressure control valve (solenoid valve) (not shown) provided between the pressure fluid source 114 and the airtightness formation part 112.

In conducting a test such as a reliability test on the wafer 8 by using the semiconductor substrate test device 110 having the above-described structure, first, the wafer 8 is placed on the stand 116 so that the terminal-containing face of the wafer 8 faces upward. Then, the contactor 14 is attached to the wafer 8 so that the pin probes 13a through 13n of the contactor 14 are positioned on the given corresponding terminals 7 formed on the wafer 8.

Next, as shown in FIG. 5B, the contact force supply device 120 is activated to press the contactor 14 down to the wafer 8 from above the airtightness formation part 112. Thereby, a contact force is generated between the pin probes 13a through 13n and the terminals 7, and, as a reacting force to the contact force, a force to deform the laminated substrate 11 via the pin probes 13a through 13n is generated in the contactor 14. With the activation of the contact force supply device 120, the pressure fluid source 114 is also activated to introduce the compressed air into the airtightness room 112a.

As previously described, the control part 124 controls the compressed air supplied from the pressure fluid source 114 to the airtightness room 112a. Here, a description will be given, with reference to FIG. 6, of an control operation performed by the control part 124.

Figure 6:
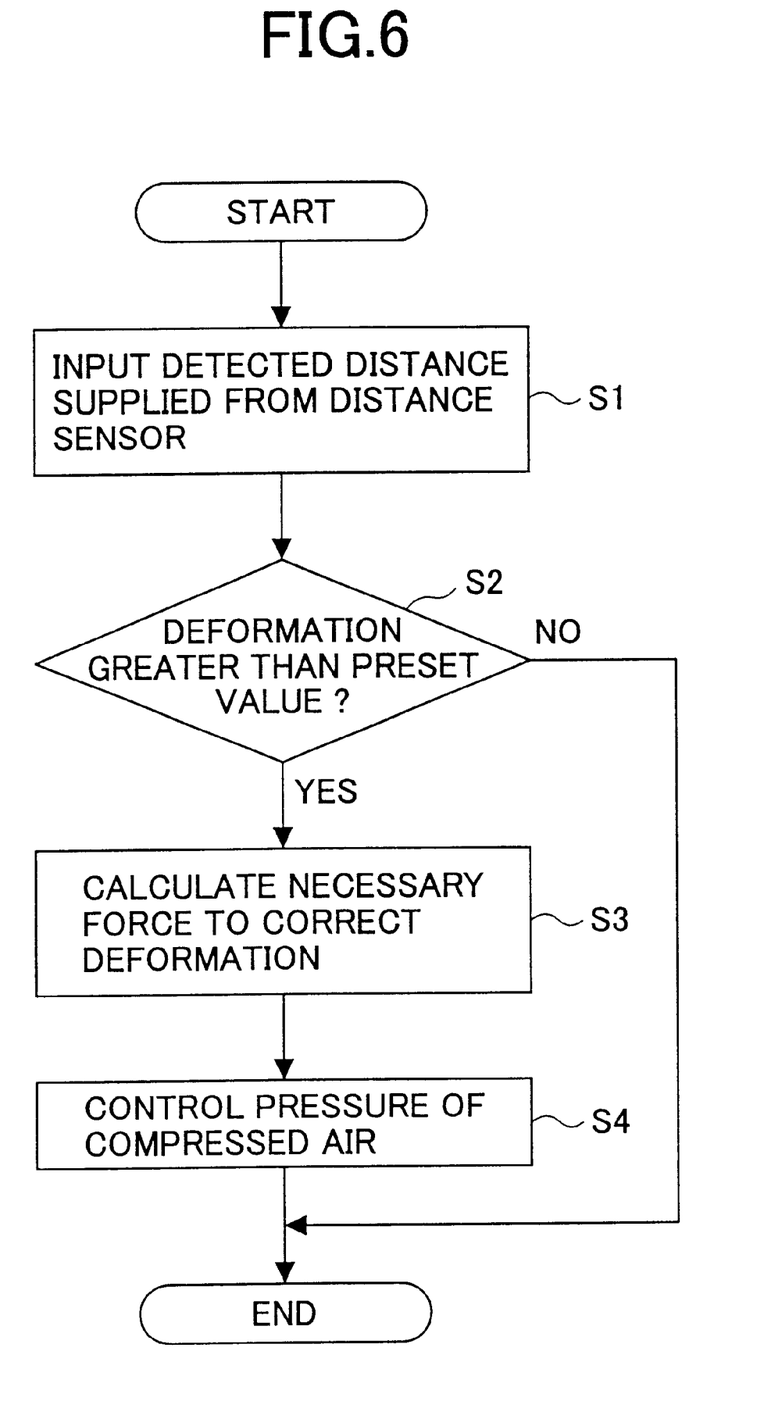
FIG. 6 is a flowchart for illustrating an operation of a deformation control device of the semiconductor substrate test device of FIG. 5A.

After the control part 124 is activated, first, in step S1, the distance L3 (between the contactor 14 and the wafer 8) measured by the distance sensor 122 is input to the control part 124 as a detected distance. Therefore, if the deformation of the peripheral part of the contactor 14 due to an increase in the contact force causes a change in the distance L3, the control part 124 can 35 recognize this change from a signal supplied from the distance sensor 122.

Next, in step S2, the control part 124 determines, based on the signal supplied from the distance sensor 122, whether the change in the distance L3 between the contactor 14 and the wafer 8, that is, the deformation of the contactor 14, is greater than or equal to a preset value. Here, the preset value is set to the maximum value of deformations of the contactor 14 with which deformations connections between the pin probes 13a through 13n and the terminals 7 of the wafer 8 can be secured. That is, if the change in the distance L3 is greater than or equal to the preset value, the electrical connections between the pin probes 13a through 13n and the terminals 7 cannot be secured.

Therefore, if it is determined in the negative in step S2, that is, if it is determined that the change in the distance L3 is smaller than the preset value and that the electrical connections between the pin probes 13a through 13n and the terminals 7 can be secured, this control operation ends because it is unnecessary to perform operations of steps S3 and S4 for generating a drag.

On the other hand, if it is determined in the affirmative in step S2, that is, if it is determined that the change in the distance L3 is greater than or equal to the preset value and that the electrical connections between the pin probes 13a through 13n and the terminals 7 may not be secured, step S3 is performed.

In step S3, the control part 124 calculates a necessary force to correct the deformation of the contactor 14 based on the above-described change. Here, the necessary force to correct the deformation of the contactor 14 can be obtained as a value of the pressure of the pressure fluid applied to the airtightness room 112a of the airtightness formation part 112. Hereinafter, this value is referred to as a target pressure value.

Next, in step S4, the control part 124, by controlling the above-described pressure control valve, controls the pressure of the compressed air generated in the pressure fluid source 114 so that the pressure of the compressed air supplied to the airtightness room 112a has the target pressure value. Thereby, by the pressure of the compressed air, a drag to press down the laminated substrate 11 is applied to the top face (the face opposite to the face opposing the wafer 8) of the laminated substrate 11.

Thereby, the deformation of the contactor resulting from the downward pressing force of the contact force supply device 120 is corrected by the drag generated in the airtightness formation part 112. As a result, the entire faces of the contactor 14 and the wafer 8 become flat without deformation, thereby securing the electrical connections between the contact electrodes 5 and the terminals 7.

In this embodiment, the airtightness formation part 112 and the pressure fluid source 114 form a drag supply device (part) of the semiconductor substrate test device 110.

Figure 7:
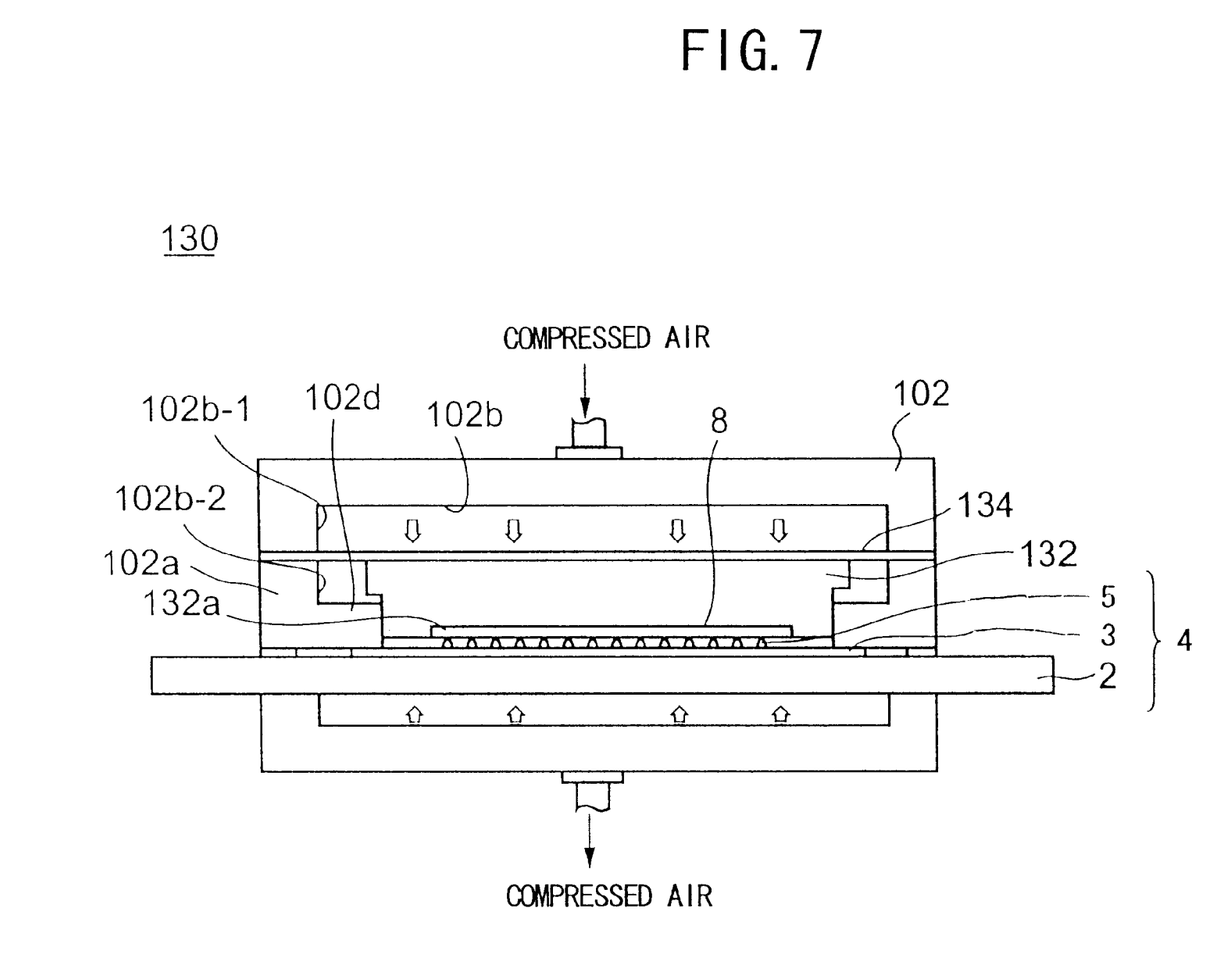
FIG. 7 is a side view of a semiconductor substrate test device according to a third embodiment of the present invention.

Next, a description will be given, with reference to FIG. 7, of a semiconductor substrate test device 130 and a semiconductor substrate test method according to a third embodiment of the present invention.

The semiconductor substrate test device 130 has a structure similar to that of the semiconductor substrate test device 100 of the first embodiment. The same elements as those of the semiconductor substrate test device 100, for instance, the pressure fluid source 104, are not shown in FIG. 6.

Figure 4:
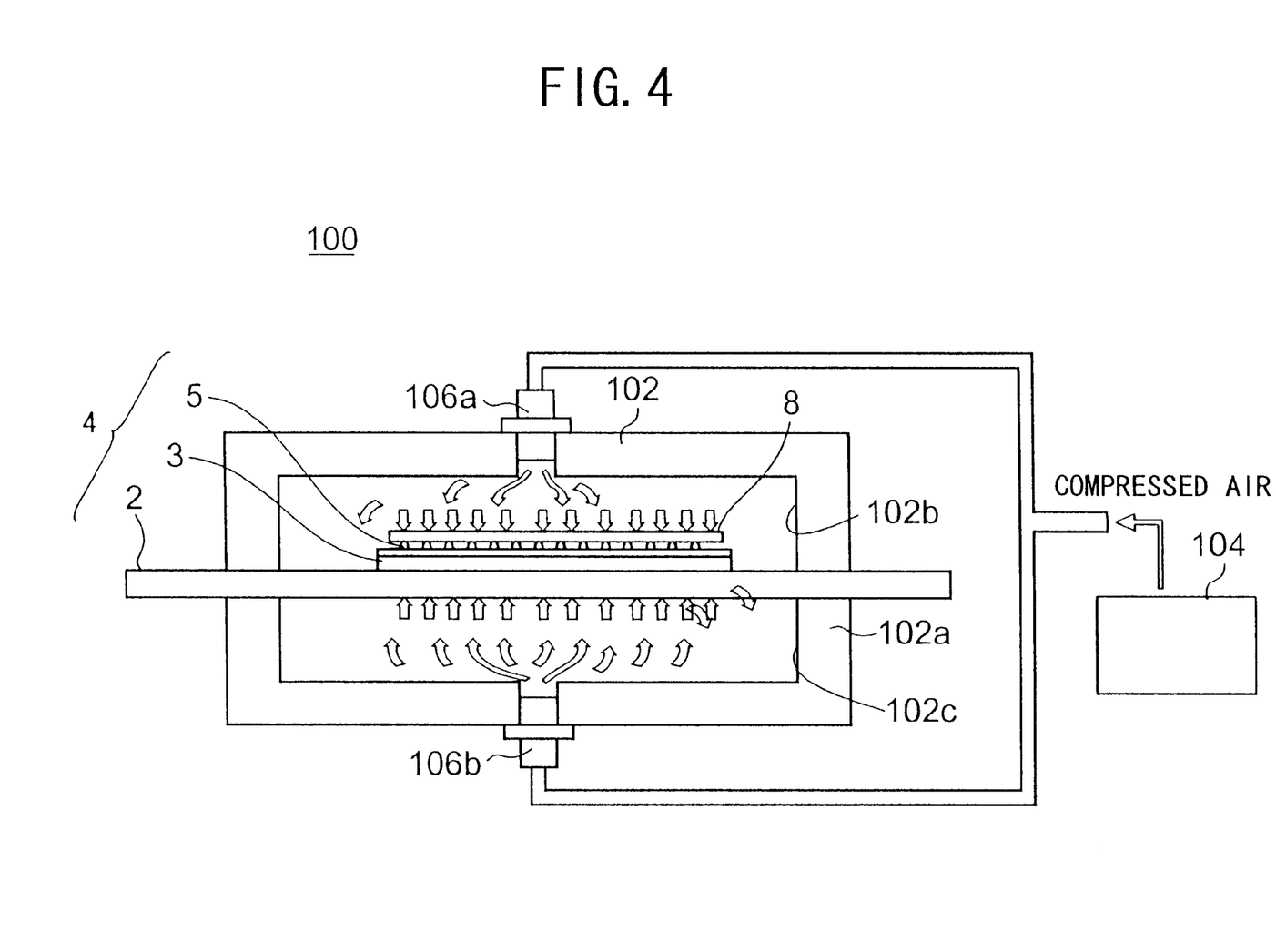
FIG. 4 is a side view of a semiconductor substrate test device according to a first embodiment of the present invention.

The semiconductor substrate test device 130 differs from the semiconductor substrate test device 100 of FIG. 4 in having a reinforcement stage (semiconductor substrate reinforcement member) 132 provided on the side of the wafer 8 which side is opposite to the terminal-containing side thereof, and a movable partition wall 134 provided on the top face of the reinforcement stage 132.

The reinforcement stage 132 has a concave part 132a formed in its bottom face for accommodating the wafer 8. The reinforcement stage 132 contacts protrusion parts 102d protruding from the sidewall 102a of the airtightness part 102, thereby substantially partitioning the side of the upper part of the reinforcement stage and the side of the lower part of the reinforcement stage. The movable partition wall 134 partitions the upper room 102b of the airtightness part 102 into an upper space 102b-1 and a lower space 102b-2 in which the reinforcement stage 132 is provided.

The semiconductor substrate test method employing the semiconductor substrate test device having the above-described structure and its effects are basically equal to the semiconductor substrate test method and its effects of the above-described first embodiment. Therefore, a description will be given only of effects peculiar to this embodiment.

In the semiconductor substrate test device provided with the reinforcement stage 132, a pressing force is applied evenly to the wafer 8 through the reinforcement stage 132. This provides a further prevention of the deformation of the contactor 4, so that the terminals 7 of the wafer 8 and the contact electrodes 5 can be electrically connected more securely. Further, the movable partition wall 134 prevents the compressed air from entering the side of the wafer 8, thereby preventing the wafer 8 from being contaminated by contaminants in the compressed air.

Next, a description will be given, with reference to FIGS. 8 and 9, of two variations of the semiconductor substrate test device 130 of the third embodiment.

Figure 8:
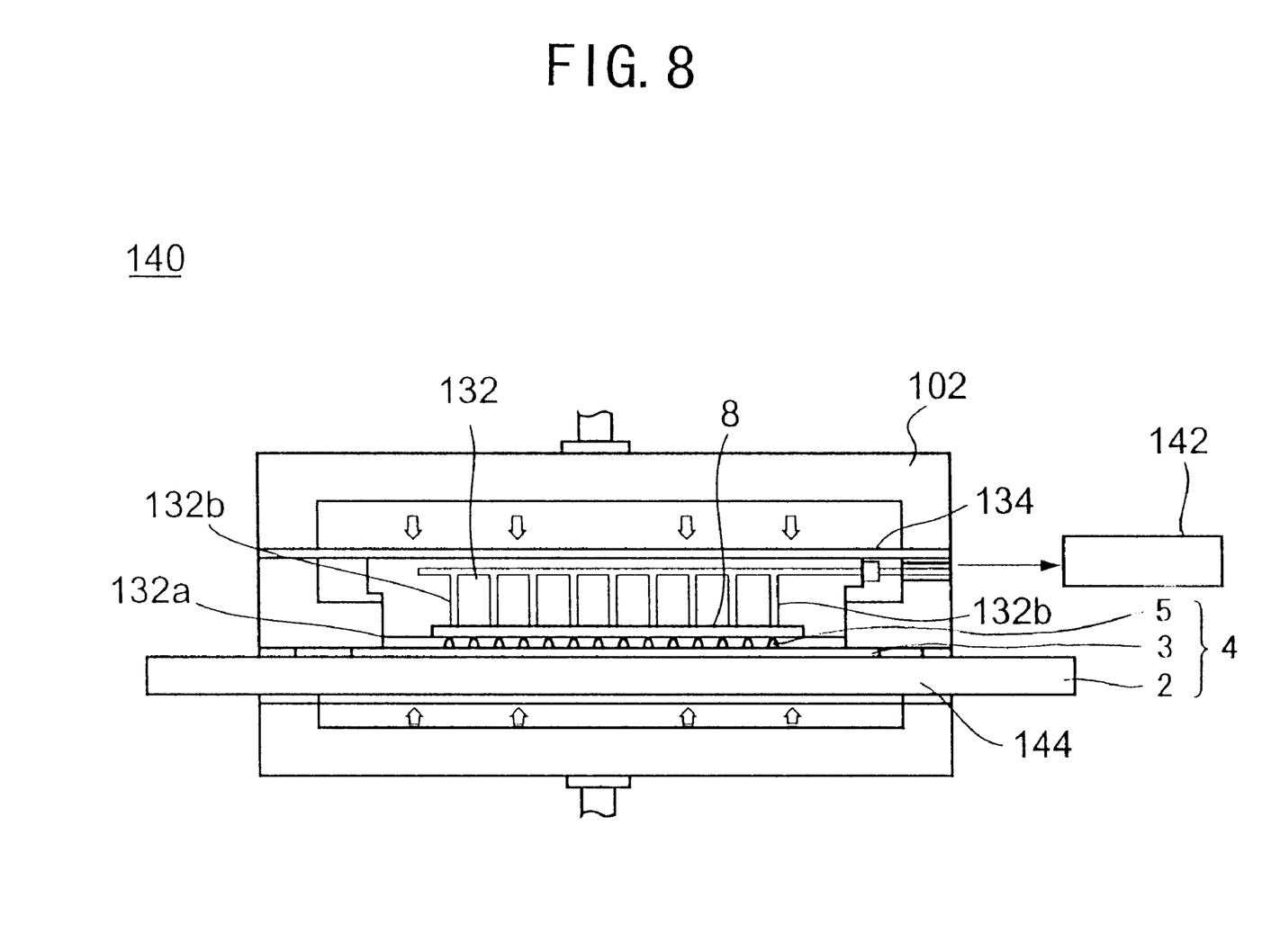
FIG. 8 is a side view of a semiconductor substrate test device that is a variation of the semiconductor substrate test device of FIG. 7.

A semiconductor substrate test device 140 of a first variation is characterized by a plurality of vacuum holes 132b formed in the reinforcement stage 132 as shown in FIG. 8. Each vacuum hole 132b has one end opening to the concave part 132a and the other end connected to a vacuum source 142.

The reinforcement stage 132 having the vacuum holes 132b and the vacuum source 142 form an attraction part of the semiconductor substrate test device 140. Further, another movable partition wall 144 is provided on the bottom side of the multilayer substrate 2 of the contactor 4 in the lower room 102c of the airtightness part 102.

The semiconductor substrate test device 140 having the above-described structure can produce the same effects as the semiconductor substrate test device 130 of the third embodiment. Further, according to the semiconductor substrate test device 140, the bottom face of the wafer 8 is attracted to the reinforcement stage 132 by suction and remains adhering thereto at the time of a semiconductor substrate test, thereby preventing the deviation of the position of the wafer 8. Moreover, the contactor 4 and the wafer 8 are prevented from being contaminated by contaminants in the compressed air introduced into the lower room 102c.

Figure 9:
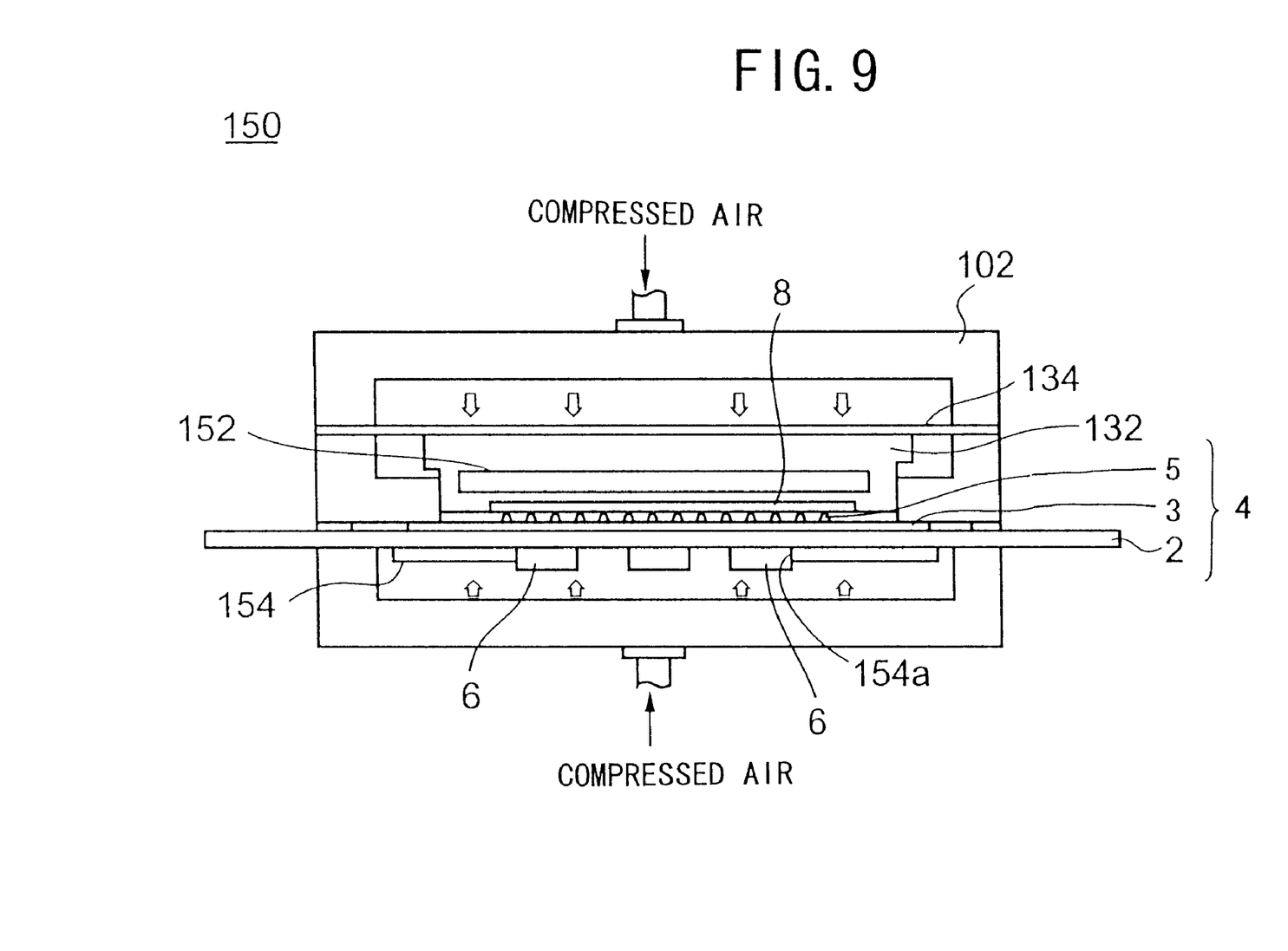
FIG. 9 is a side view of a semiconductor substrate test device that is another variation of the semiconductor substrate test device of FIG. 7.

A semiconductor substrate test device 150 of a second variation is characterized by a heater (temperature control part) 152 provided in the reinforcement stage 132 as shown in FIG. 9. The heater 152 is connected to a heat application source (not shown). The semiconductor substrate test device 150 also includes a reinforcement stage (contactor reinforcement member) 154, which has a center opening 154a, provided in a position on the bottom face of the multilayer substrate 2 of the contactor 4, which position corresponds to the peripheral part of the reinforcement stage 132. The semiconductor substrate test device 150 further includes the electronic circuit components 6 for an LSI test support. The electronic circuit components 6 are provided on the bottom face of the multilayer substrate 2 inside the opening 154a of the reinforcement stage 154.

The semiconductor substrate test device 150 having the above-described structure can produce the same effects as the semiconductor substrate test device 130 of the third embodiment. Further, by directly warming the wafer 8 by means of the heater 152 at the time of a semiconductor substrate test, the wafer 8 can be easily and accurately controlled to have a predetermined test temperature.

Moreover, the reinforcement stage 154 provides a further prevention of the deformation of the multilayer substrate 2 of the contactor 4, thereby preventing the removal of the electronic circuit components from the multilayer substrate 2.

Next, a description will be given, with reference to FIG. 10, of a semiconductor substrate test device 160 and a semiconductor substrate test method according to a fourth embodiment of the present invention.

The semiconductor substrate test device 160 includes the membrane-type contactor 4, the airtightness part 102, a pair of piezoelectric elements 162a and 162b having the same specifications, and a voltage generation part 164 for generating voltages to be applied to the piezoelectric elements 162a and 162b. Further, the semiconductor substrate test device 160 includes the reinforcement stage 132 for holding the wafer 8.

Figure 10:
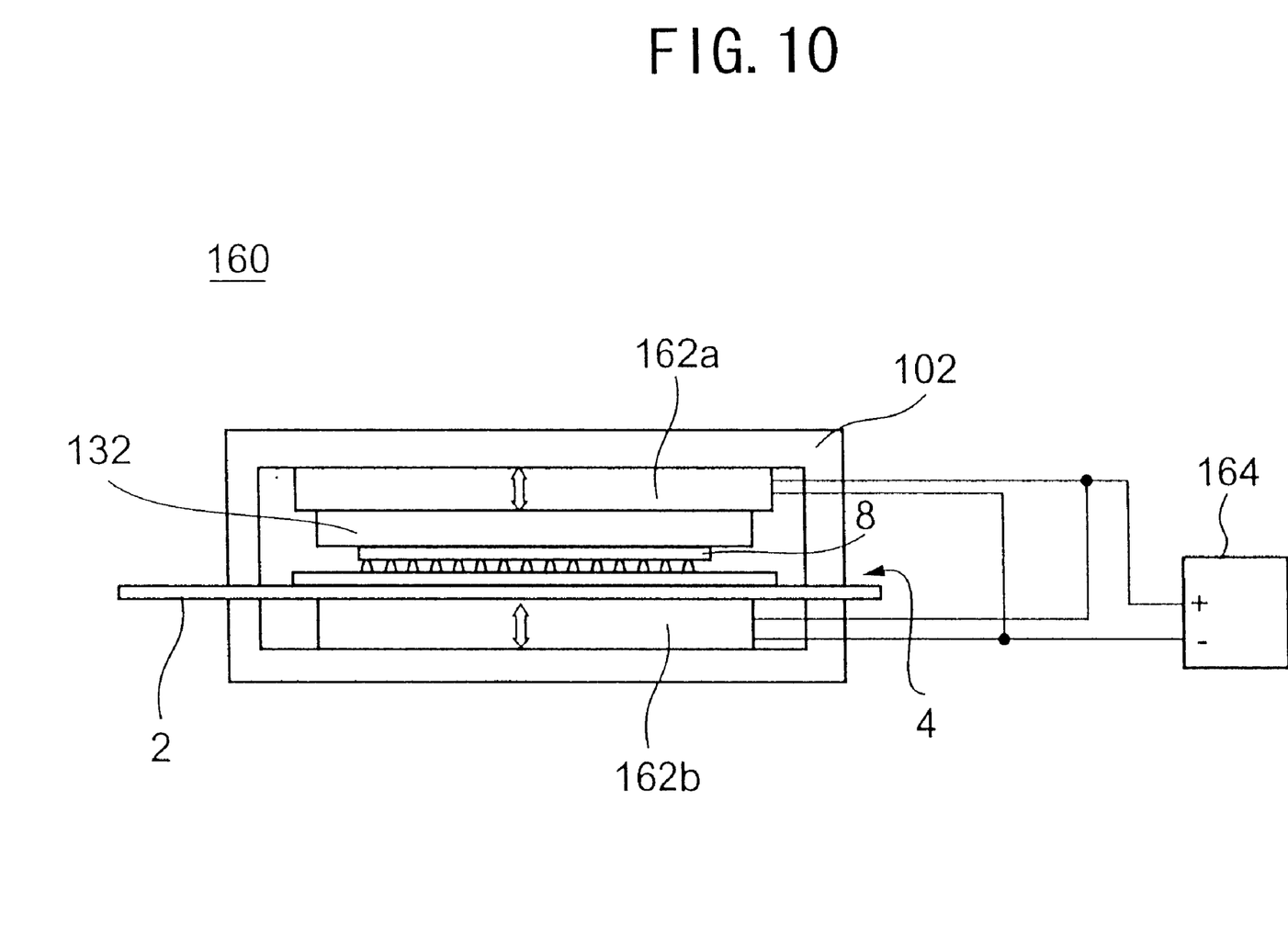
FIG. 10 is a side view of a semiconductor substrate test device according to a fourth embodiment of the present invention.

As shown in FIG. 10, the piezoelectric element 162b is provided on the bottom face of the multilayer substrate 2 of the contactor 4, and the piezoelectric element 162c is provided on the top face of the reinforcement stage 132 holding the wafer 8.

In conducting a semiconductor substrate test by using the semiconductor substrate test device 160, first, the wafer 8 is attached on the contactor 4 so that the terminals 7 are positioned on the contact electrodes 5. Then, by attaching a housing (not shown) to the contactor 4, the piezoelectric elements 162a and 162b are positioned. on the reinforcement stage 132 and the bottom face of the multilayer substrate 2, respectively.

Next, the voltage generation part 164 is driven to apply the voltages to the piezoelectric elements 162a and 162b, thereby generating the distortions thereof. The distortion of the piezoelectric element 162a presses down the wafer 8, while the distortion of the piezoelectric element 162b presses up the contactor 4. Therefore, one of the piezoelectric elements 162a and 162b generates a contact force, while the other generates a drag.

Thus, by the piezoelectric elements 162a and 162b, only a force necessary as the contact force is generated without generating an excessive pressing force that may deform the contactor 4. Further, it is also possible to control the voltages to be applied to the piezoelectric elements 162a and 162b in the voltage generation part 164. Therefore, it is possible to control the distortions of the piezoelectric elements 162a and 162b so as to generate the contact force and the drag of the same magnitude.

Thereby, the deformations of the contactor 4 and the wafer 8 are prevented, thus securing the electrical connections between the contact electrodes 5 and the terminals 7 over the entire faces of the contactor 4 and the wafer 8, respectively. Further, in this embodiment, the reinforcement stage 132 prevents the deformations of the contactor 4 and the wafer 8 with more reliability. This also improves the electrical connections between the contact electrodes 5 and the terminals 7.

The present invention is not limited to the specifically disclosed embodiments, but variations and modifications may be made without departing from the scope of the present invention.

The present application is based on Japanese priority application No. 2000-232304 filed on Jul. 31, 2000, the entire contents of which are hereby incorporated by reference.

What is claimed is:

1. A semiconductor substrate test device comprising:

a contactor having contact electrodes formed on a first face thereof, the contact electrodes being connected with terminals formed on a first face of a semiconductor substrate; and a drag supply part supplying a drag to prevent a deformation of said contactor, the deformation being caused by a contact force generated when the contact electrodes are placed in contact with the terminals.

2. The semiconductor substrate test device as claimed in claim 1, wherein said drag supply part supplies the drag equivalent to the contact force in magnitude.

3. The semiconductor substrate test device as claimed in claim 1, wherein said drag supply part changes a magnitude of the drag in accordance with that of the contact force.

4. The semiconductor substrate test device as claimed in claim 1, wherein said drag supply part generates the drag by fluid pressure.

5. The semiconductor substrate test device as claimed in claim 1, wherein said drag supply part supplies the drag from a first side opposite to a second side on which the contact force is exerted.

6. The semiconductor substrate test device as claimed in claim 5, further comprising a contact force supply part supplying the contact force, the contact force supply part having a structure substantially equal to that of said drag supply part.

7. The semiconductor substrate test device as claimed in claim 6, wherein said drag supply part and said contact force supply part generate the drag and the contact force by fluid pressure, respectively.

8. The semiconductor substrate test device as claimed in claim 7, wherein one of said drag supply part and said contact force supply part comprises a movable partition wall moved by the fluid pressure.

9. The semiconductor substrate test device as claimed in claim 7, wherein each of said drag supply part and said contact force supply part comprises a movable partition wall that is moved by the fluid pressure.

10. The semiconductor substrate test device as claimed in claim 6, wherein one of said drag supply part and said contact force supply part comprises a piezoelectric element for generating the drag or the contact force.

11. The semiconductor substrate test device as claimed in claim 6, wherein both of said drag supply part and said contact force supply part comprise piezoelectric elements for generating the drag and the contact force, respectively.

12. The semiconductor substrate test device as claimed in claim 1, wherein said contactor has an electronic component mounted thereon, the electronic component being employed for a semiconductor substrate test.

13. The semiconductor substrate test device as claimed in claim 1, further comprising a semiconductor substrate reinforcement member preventing a deformation of the semiconductor substrate, the semiconductor substrate reinforcement member being provided on a second face of the semiconductor substrate, the second face being parallel to the first face thereof.

14. The semiconductor substrate test device as claimed in claim 13, further comprising an attraction part preventing a deviation between positions of said semiconductor substrate reinforcement member and the semiconductor substrate.

15. The semiconductor substrate test device as claimed in claim 13, wherein said semiconductor substrate reinforcement member comprises a temperature control part controlling a temperature of the semiconductor substrate.

16. The semiconductor substrate test device as claimed in claim 13, further comprising a contactor reinforcement member having the same stiffness as said semiconductor substrate reinforcement member, the contactor reinforcement member being provided on a second face of said contactor, the second face being parallel to the first face thereof.

17. The semiconductor substrate test device as claimed in claim 1, further comprising a sensor detecting the deformation of said contactor, wherein said drag supply part comprises a deformation control part generating the drag to eliminate the deformation of said contactor.

18. The semiconductor substrate test device as claimed in claim 17, wherein said deformation control part generates the drag based on the detected deformation supplied from said sensor.

19. A semiconductor substrate test device comprising:

a contactor having contact electrodes formed thereon, the contact electrodes being connected with terminals formed on a semiconductor substrate;

a sensor detecting a deformation of said contactor, the deformation being caused by a contact force generated when the contact electrodes are placed in contact with the terminals; and a deformation control part generating a drag to eliminate the deformation.

20. A method of testing a semiconductor substrate comprising the steps of:

(a) placing contact electrodes formed on a contactor in contact with terminals formed on the semiconductor substrate; and (b) providing a contact force to place the contact electrodes in contact with the terminals and a drag to prevent a deformation of the contactor caused by the contact force.

21. The method as claimed in claim 20, wherein the contact force and the drag are generated by fluid pressures of an identical magnitude.

22. The method as claimed in claim 21, wherein the fluid pressures are generated by a single pressure source.

23. A method of testing a semiconductor substrate by placing contact electrodes formed on a contactor in contact with terminals formed on the semiconductor substrate, comprising the steps of:

(a) detecting a deformation of the contactor; and (b) providing a drag to eliminate the deformation.

24. The method as claimed in claim 23, wherein said step (b) comprises the steps of:

(c) comparing the deformation with a preset value; and (d) calculating the drag based on a result of said step (c).

* * * * *